US009325153B2

(12) United States Patent
Otobe et al.

(10) Patent No.: US 9,325,153 B2
(45) Date of Patent: Apr. 26, 2016

(54) METHOD TO CONTROL TRANSMITTER OPTICAL MODULE

(71) Applicant: Sumitomo Electric Device Innovations, Inc., Yokohama-shi (JP)

(72) Inventors: Kenji Otobe, Fujisawa (JP); Kenichi Nakayama, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 63 days.

(21) Appl. No.: 14/465,615

(22) Filed: Aug. 21, 2014

(65) Prior Publication Data

US 2015/0055946 A1 Feb. 26, 2015

(30) Foreign Application Priority Data

Aug. 21, 2013 (JP) ................................ 2013-171560

(51) Int. Cl.
*H04B 10/564* (2013.01)
*H01S 5/0683* (2006.01)
*H01S 5/068* (2006.01)

(52) U.S. Cl.
CPC ........... *H01S 5/0683* (2013.01); *H01S 5/06804* (2013.01); *H01S 5/06808* (2013.01)

(58) Field of Classification Search
CPC ..................................................... H04B 10/564
See application file for complete search history.

(56) References Cited

U.S. PATENT DOCUMENTS

2004/0028099 A1* 2/2004 Hongo .................. G02F 1/0123 372/38.02
2010/0265076 A1* 10/2010 Ichino ................ H01S 5/06804 340/584

FOREIGN PATENT DOCUMENTS

JP H11-126939 A 5/1999
JP 2004-061556 A 2/2004
JP 2011-165714 A 8/2011

* cited by examiner

*Primary Examiner* — Shi K Li
(74) *Attorney, Agent, or Firm* — Venable LLP; Michael A. Sartori

(57) ABSTRACT

An optical module capable of monitoring an inner temperature thereof by a simple arrangement is disclosed. The optical module installs an avalanche photodiode (APD). The APD generates the first photocurrent under a bias where the APD shows the multiplication factor thereof M equal to the unity, and the second photocurrent under another bias where the multiplication factor becomes greater than the unity. The operating temperature of the laser diode (LD) may be estimated from a ratio of the first photocurrent to the second photocurrent.

13 Claims, 7 Drawing Sheets

1B
33
$L_1$
31
10B
14
$C_1$
12
11
13
43
41
32
A
15
$L_{MON}$
$L_{OUT}$
$C_2$
$V_{APD}$
$I_{APD}$
16
21
$L_2$
34
17
22
44
42
$T_{SENSE}$ 1A
10A
11
12
21
22
31
32
33
34
A
$L_{OUT}$
$L_{MON}$
$T_{SENSE}$
$I_{APD}$
$V_{APD}$ 1B
42
44
41
$L_1$
$C_1$
43
$C_2$
$L_2$
$L_{OUT}$
$T_{SENSE}$
14
13
11
22
21
$L_{MON}$
33
10B
12
15
16
17
31
32
A
34
$I_{APD}$
$V_{APD}$

METHOD TO CONTROL TRANSMITTER OPTICAL MODULE

BACKGROUND OF THE INVENTION

1. Field of the Invention

The present application relates to a method to control an optical transmitter, in particular, the present application relates to an algorithm to set a bias current in a semiconductor laser diode (hereafter denoted as LD) depending on a temperature thereof.

2. Related Background Art

The optical communication system installs a transmitter optical sub-assembly (TOSA) to convert an electrical signal to be transmitted into an optical signal. A TOSA generally includes a light-emitting device, typically an LD and a light-receiving device, typically a photodiode (hereafter denoted as PD), to monitor output power of the LD. An LD has been well known as a semiconductor device having large temperature dependence in various control parameters thereof. For instance, an LD shows large temperature depended in the I-L characteristic, namely, the output power against the input bias current. Accordingly, the bias current and the modulation current supplied to an LD are necessary to be precisely adjusted depending on a temperature to keep an average power and an extinction ratio of the optical output in a wide temperature range.

Various techniques have been reported in prior arts. For instance, the bias current supplied to the LD, and the bias voltage and the modulation amplitude supplied to the electro-absorption (hereafter denoted as EA) modulator, where they are installed within a TOSA, is precisely adjusted depending on an inner temperature of the TOSA which is monitored by a temperature sensor such as thermistor installed within the TOSA. Another technique controls a temperature of a thermo-electric cooler (hereafter denoted as TEC) which is installed within the TOSA and controls a temperature of the devices mounted thereon.

However, a TOSA installing a temperature sensor is necessary to provide an additional lead terminal to extract a signal corresponding to the temperature generated by the temperature sensor from the TOSA. Such a TOSA providing additional pins is hard to make the TOSA in compact.

SUMMARY OF THE INVENTION

One aspect of the present invention relates to a method to set a bias current in an LD that accompanies with an avalanche photodiode (hereafter denoted as APD) to monitor the optical power output from the LD. The APD is set in a thermal condition same with a thermal condition of the LD. The method includes steps of: (1) measuring a first photocurrent generated by the APD as providing a first bias to the APD, where the first bias sets the multiplication factor of the APD equal to the unity; (2) measuring a second photocurrent also generated by the APD as providing a second bias to the APD, where the second bias sets the multiplication factor of the APD greater than the unity; (3) determining the temperature of the LD by calculating a ratio of the first photocurrent against the second photocurrent; and (4) providing another bias current to the LD, where the another bias current corresponds to the determined temperature of the LD.

Another aspect of the present application relates to a transmitter optical module that comprises an optical source, and a temperature detector, but no temperature sensor. The optical source includes an LD and an APD, where both devices a set in a thermal condition same to each other. The APD monitors the amplitude of light output from the LD and generates a photocurrent corresponding to the amplitude. The temperature detector sets a first bias and a second bias to the APD to determine a temperature of the APD by calculating a ratio of the first photocurrent taken at the first bias against the second photocurrent taken at the second bias. In the transmitter optical module, the first bias sets the multiplication factor of the APD substantially equal to unity, while, the second bias sets the multiplication factor greater than the unity.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF THE PREFERRED EMBODIMENTS

Next, some embodiments of the present invention will be described as referring to drawings. In the description of the drawings, numerals or symbols same with or similar to each other will refer to elements same with or similar to each other without duplicating explanations.

First Embodiment

Figure 1:
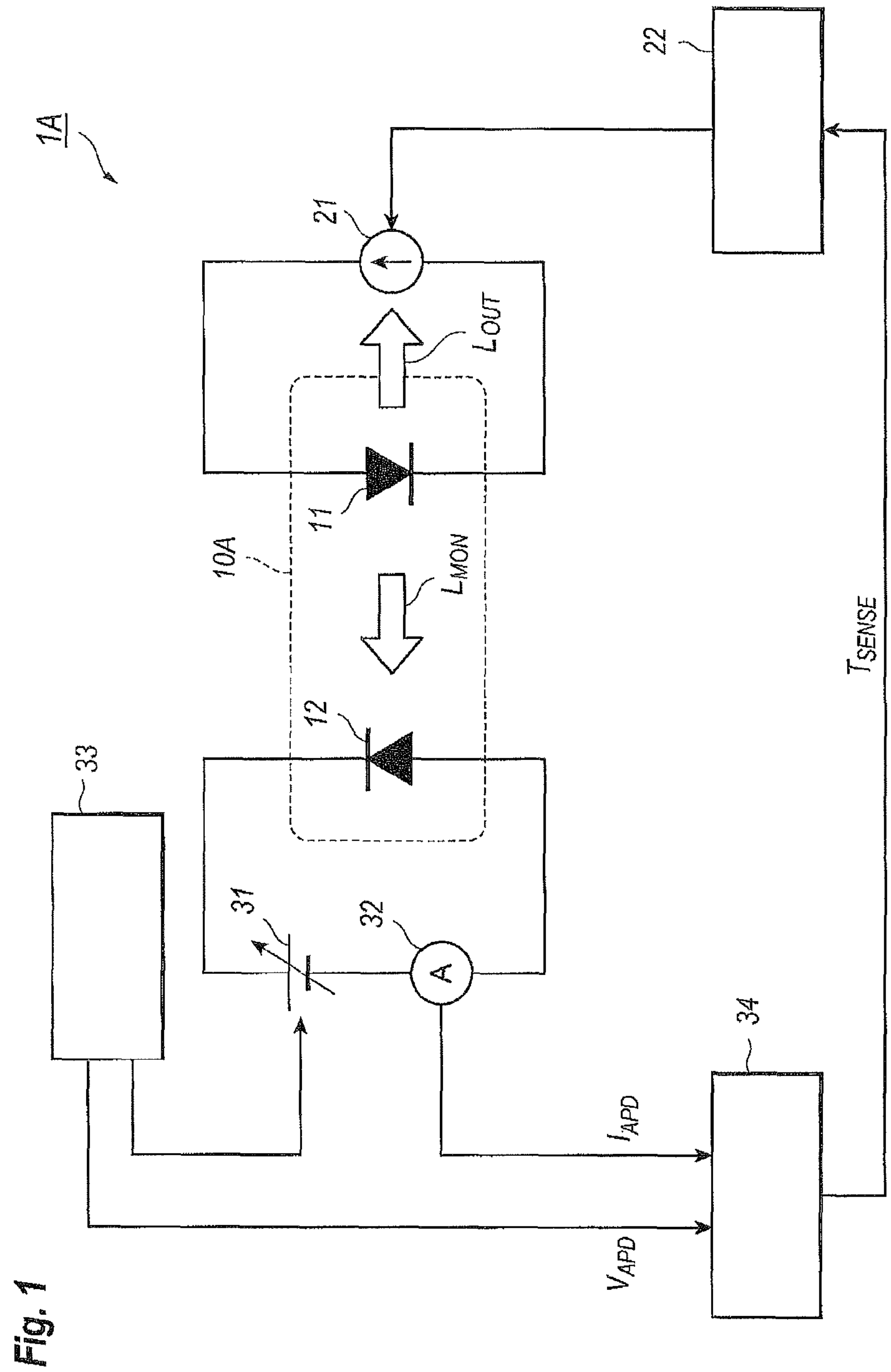
FIG. 1 shows a functional block diagram of a transmitter optical module according to the first embodiment of the present invention.

The first embodiment of a method to control a transmitter optical module according to the first embodiment will be described. FIG. 1 is a functional block diagram of a transmitter optical module 1A according to the first embodiment. The transmitter optical module 1A provides an optical source 10A including an LD 11 and an APD 12. The optical source 10A of the present embodiment is a type of, what is called, the direct driven source where the LD 11 is supplied with both of a bias current and a modulation current to output light $L_{OUT}$.

The output light $L_{OUT}$ is output from the transmitter optical module 1A as transmitting light to an optical fiber which is not illustrated in FIG. 1. The LD 11 also outputs monitored light $L_{MON}$ concurrently with the output light $L_{OUT}$. The output light $L_{OUT}$ has a wavelength of, for instance, 1.3 μm; but the wavelength varies depending on a temperature of the LD 11.

The APD 12 receives the monitored light $L_{MON}$ output from the LD 11, and generates a photocurrent depending on the amplitude of the monitored light $L_{MON}$. The automatic power control (APC), which is not illustrated in FIG. 1, receives the photocurrent and controls the bias currents supplied to the LD 11 so as to keep the amplitude of the photocurrent in constant. As described in detail later, the APD 12 of the present embodiment is used for sensing a temperature of the LD 11. The APD 12 is arranged in a vicinity of the LD 11 in a CAN package so as to couple optically to each other. Accordingly, the APD 12 may be regarded to have a temperature substantially same with a temperature of the LD 11, or the APD 12 is set in a thermal condition same as those of the LD 11.

The LD 11 is supplied with the bias current and the modulation current from the current source 21; and the current controller 22 controls the bias current and the modulation current based on a signal $T_{SENSE}$ which corresponds to the temperature of the APD 12, equivalently the temperature of the LD 11, and generated in the temperature detector 34.

The APD 12 is coupled with the bias source 31 and a current detector 32 connected in series to the bias source 31. The bias source 31, which is a type of the variable voltage source, supplies a bias to the APD 12, where the bias is determined by the bias controller 33. The bias, as described layer, has two modes, namely, the PD mode and the APD mode. The bias controller 33 sets the bias in the APD 12 such that the multiplication factor of the APD becomes unity (M=1) in the PD mode; while, the bias controller 33 sets the bias such that the multiplication factor M becomes greater than unity (M>1) in the APD mode. The bias source 31 may vary the output voltage thereof from 0 to 30 V. The current detector 32 detects the amplitude of the photocurrent output from the APD 12.

The amplitude of the photocurrent detected by the current detector 32 and the bias supplied to the APD 12 from the bias source 31 are provided to the temperature detector 34; and the temperature detector 34 determines the temperature of the APD 12 from two parameters, the photocurrent $I_{APD}$ and the bias voltage $V_{APD}$, according to an algorithm described later. The temperature thus determined by the temperature detector 34 is provided to the current controller 22. The temperature detector 34 may hold in, for instance, memory a relation between the temperature and the multiplication factor M of the APD 12, namely, the temperature dependence of the multiplication factor M of the APD 12.

Next, the algorithm to determine the temperature of the APD 12 based on two parameters of the photocurrent and the bias performed in the temperature detector 34 will be described.

Figure 2:
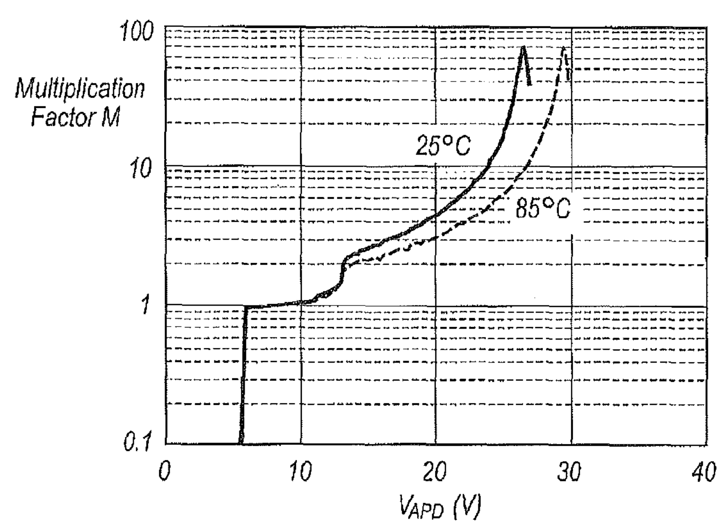
FIG. 2 shows a relation of the multiplication factor M of an APD against bias voltage.

FIG. 2 shows typical characteristics of the multiplication factor of an APD against the bias and the temperature. The multiplication factor M physically means that how many electron-hole pairs are generated from one photon entering the APD. The solid line and the broken line in FIG. 2 correspond to behaviors of the multiplication factor M at a room temperature (25° C.) and at a high temperature (85° C.), respectively.

As shown in FIG. 2, the bias of about 6 V sets the multiplication factor M in unity (=1) independent of the temperature, which means that one photon entering the APD 12 generates only one electron-hole pair. When the bias from about 6 V to about 13 V, the multiplication factor M gradually increases also independent of the temperature as the bias becomes greater; and when the bias reaches 13 V, the multiplication factor M drastically increases in stepwise manner. Further increasing the bias from 13 V, the multiplication factor M increases but a rate of the increase depends on the temperature. That is, the multiplication factor M at temperature of 25° C. exceeds that at the temperature of 85° C. Specifically, the multiplication factor M at the bias of about 25 V becomes the maximum of 70 at 25° C.; while, the multiplication factor M at 85° C. becomes the maximum of 70 at the bias of about 29 V. Further increasing the bias, the multiplication factor M turns to decrease in both temperatures.

Figure 3:
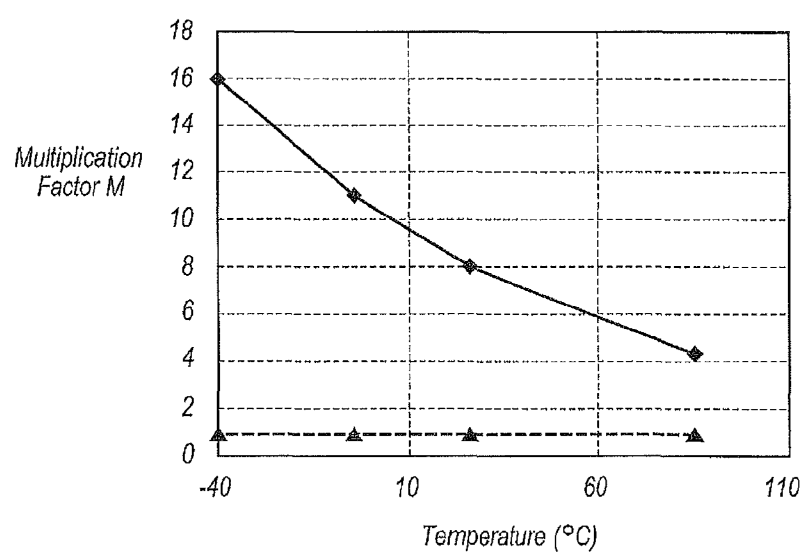
FIG. 3 shows a temperature characteristic of the multiplication factor.

FIG. 3 shows the temperature dependence of the multiplication factor M of an APD in the PD mode (M~1) and the APD mode (M>1). The solid line corresponds to the APD mode where the bias is set in 25 V, while, the broken line shows the behavior at the PD mode where the bias is set in 8 V. The PD mode by the broken line shows the temperature independent result, that is, the multiplication facto M at the bias of 8 V shows substantially no temperature dependence. On the other hand, the multiplication factor M under the bias of 25 V explicitly shows a negative temperature dependence, that is, the multiplication factor M is about 16 at −40° C., about 8 at 25° C., and about 5 at 85° C. Accordingly, comparing the multiplication factor M taken in the APD mode and that taken in the PD mode, the temperature of the APD may be estimated. Because the multiplication factor M taken in the PD mode is inevitably unity, the temperature of the APD 12 may be estimated from the multiplication factor M at the APD mode.

Figure 4:
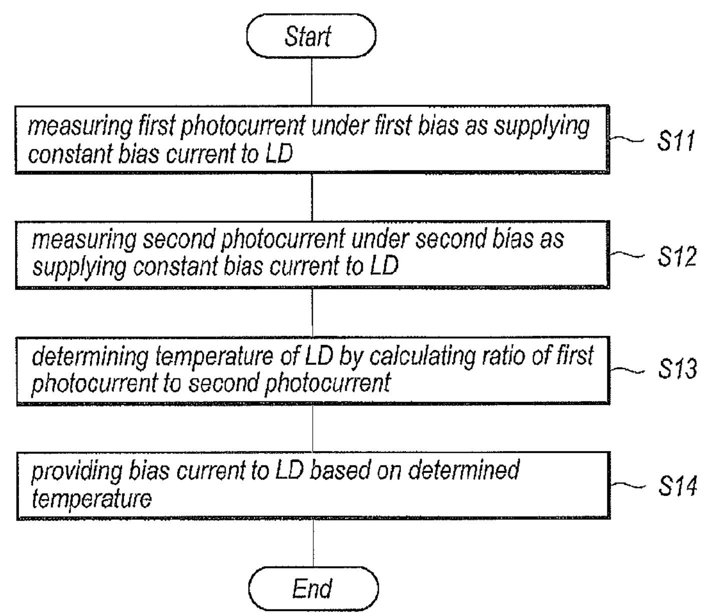
FIG. 4 shows a flow chart of a method to set a bias current to an LD of the transmitter optical module according to the first embodiment.

Next, referring to FIG. 4, a method to control the optical source 10A according to the present embodiment will be described based on the temperature behavior of the multiplication factor M of an APD described above. FIG. 4 is a flow chart showing the method to control the optical source 10A.

First, at step S11, the bias controller 33 controls the bias source 31 such that the bias source 31 outputs the first bias to the APD 12 under which the APD 12 shows the multiplication factor M substantially equal to the unity (M=1), that is, the APD 12 is set in the PD mode. The first bias is set to be, for instance, 8 V. The current detector 32 detects a first photocurrent corresponding to the bias of 8 V and forwards thus detected photocurrent to the temperature detector 34.

Next, at step S12, the bias controller 33 commands the bias source 31 such that the bias source 31 outputs the second bias to the APD 12, where the second bias sets the APD 12 in the APD mode, that is, the multiplication factor M of the APD 12 becomes greater than the unity (M>1). In an embodiment, the second bias is set to be 25 V. The current detector 32 detects a second photocurrent corresponding to the bias of 25 V and transfers the second photocurrent to the temperature detector 34.

The temperature detector 34 calculates a ratio of the first photocurrent at the bias of 8 V against the second photocurrent at the bias of 25 V, and determines the temperature of the APD 12 based on thus calculated ratio, at step S13. As shown in FIG. 3, the multiplication factor M at the bias of 8 V is substantially unity; accordingly, the ratio of two photocurrents becomes substantially the multiplication factor M at the bias of 25 V.

The temperature detector 34 stores in, for instance, a read-only memory (ROM), relations of the temperatures of the APD 12 and the multiplication factor M at respective temperatures. The temperature detector 34 compares the ratio of two photocurrents with the multiplication factors M in the memory, and determines the current temperature of the APD 12 at which the multiplication factor M stored in the memory is closest to the ratio of two photocurrents. Because the APD 12 is placed enough close to the LD 11, or, the APD 12 is set in the thermal condition same with those of the LD 11, the temperature of the APD 12 thus determined by the temperature detector 34 may be regarded as the temperature of the LD 11. Thus, steps S11 to S13 may determine the temperature of the LD 11.

In steps S11 to S13 above described, the LD 11 is biased in the constant current mode under which the LD 11 is supplied with a constant current. In the constant current mode, the monitored light $L_{MON}$, the temperature of the LD11, and that of the APD 12 may be regarded to be constant during the control of the optical source 10A.

After step S13, the temperature detector 34 outputs a current status corresponding to the temperature of the LD 11 to the current controller 22. The current controller 22 controls the current source 21 such that the current source 21 supplies to the LD 11 the bias current corresponding to the current temperature of the LD 11 at step S14.

Steps S11 to S13 to determine the temperature of the LD 11 may be optionally performed. One example, the temperature of the LD 11 is determined by the APD 12 just after setting the wavelength of the light emitted from the LD 11, the temperature of the LD 11 may be subsequently determined with a constant interval. In this case, the APD 12 ordinarily monitors amplitude of the monitored light $L_{MON}$ emitted from the LD 11 and stops the monitoring only when the APD 12 detects the temperature of the LD 11.

According to the method thus described to control the optical source 10A of the first embodiment, the multiplication factor M of the APD 12 may be determined by calculating a ratio of the first photocurrent without any optical multiplication against the second photocurrent with the optical multiplication. The multiplication factor M of an APD strongly depends on the temperature. Accordingly, the ratio of the first photocurrent against the second photocurrent may reflect the temperature of the LD 11. In other words, the temperature of the LD 11 may be determined through the ratio of the first photocurrent against the second photocurrent. In the optical source 10A, the APD 12 performs a function to monitor the amplitude of the output light $L_{OUT}$ emitted from the LD 11. Such a device to monitor the amplitude of the light is ordinarily installed within an optical source and the optical source inevitably provides a lead terminal to extract the amplitude of the light out of the optical source. Accordingly, in the present optical source 10A, and the method to control the optical source 10A, the temperature of the LD 11, or the inner temperature of the optical source 10A, may be extracted from the optical source 10A without providing additional lead pins specific to the temperature of the LD 11.

Another method to determine the temperature of the LD 11 has been known, where the method, using a general purpose diode, measures a forward voltage of the diode as supplying a constant current. However, such a diode, a general purpose diode, generally has relatively smaller temperature dependence in the forward bias thereof. Accordingly, although a general purpose diode may roughly determine an inner temperature of the optical source 10A, or a temperature of the LD, such a general purpose diode would be inadequate to determine the temperature precisely. Accordingly, a general purpose diode would be hard to be installed in a system, for instance, the wavelength division multiplexing (WDM) system, where the emission wavelength of the LD 11 is necessary to be precisely determined. On the other hand, an APD generally shows large temperature dependence, as shown in FIG. 3, which means that the temperature of the LD 11 may be precisely controlled.

The optical source 10A described above has the procedure of supplying the bias voltage and detecting the photocurrent output from the APD 12 by the current detector 32, which is common to both of the first photocurrent and the second photocurrent. The circuit to perform the process above only requires the variable voltage source to supply bias to the APD 12 and the current detector to detect the current. Accordingly, the method of the present embodiment may detect the inner temperature of the optical source by a simplified circuit.

The method supplies a constant current in respective steps, S11 and S12, where step S11 detects the first photocurrent, while, step S12 detects the second photocurrent, which means that no variation of the operating temperature of the LD 11 may be regarded between two modes of detecting the first photocurrent and the second photocurrent. Accordingly, the first photocurrent and the second photocurrent may be regarded for the input optical power equal to each other. The ratio of the first photocurrent to the second photocurrent exactly reflects the inner temperature of the optical source 10A.

Second Embodiment

Figure 5:
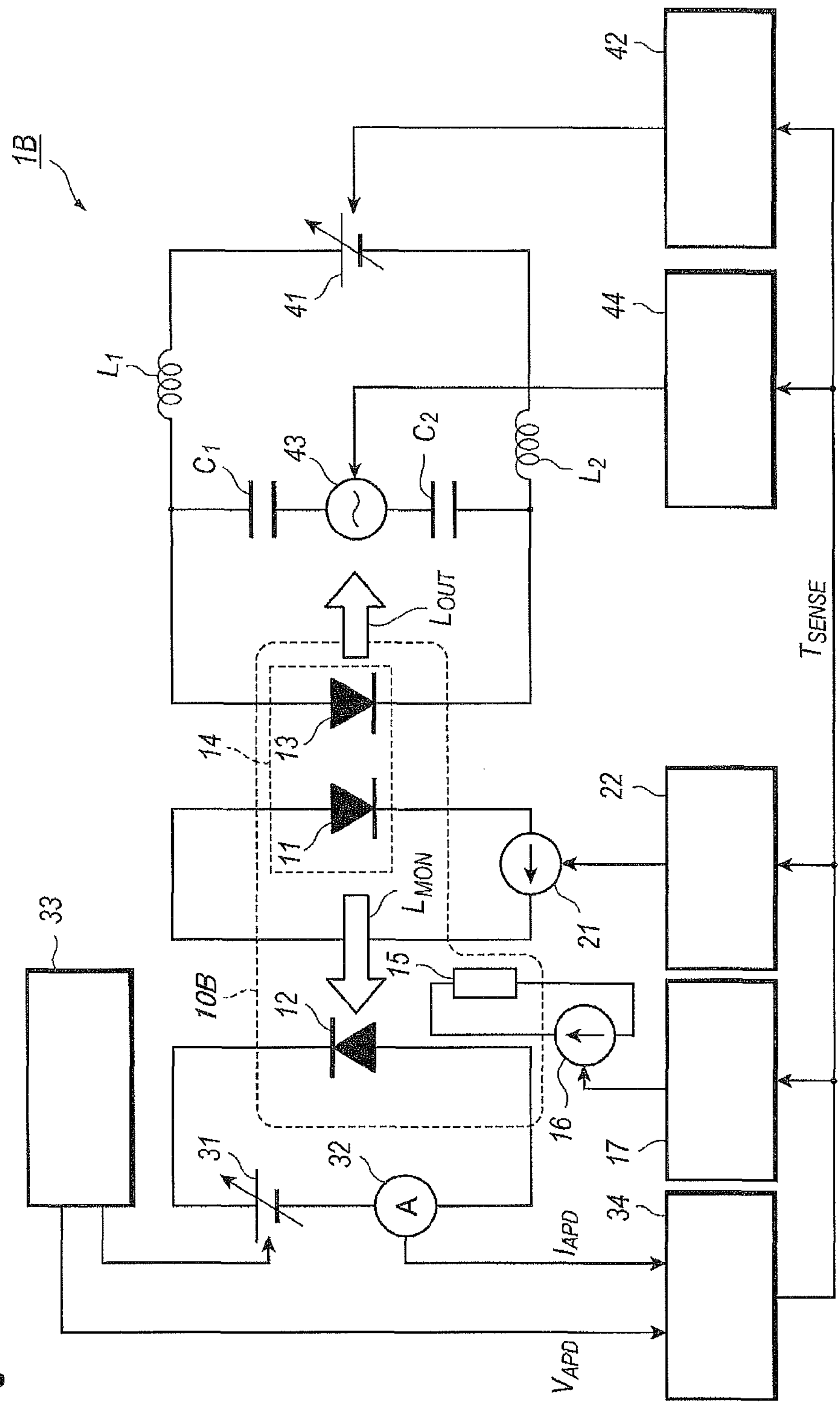
FIG. 5 shows a functional block diagram of another transmitter optical module according to the second embodiment of the present invention.

A method according to the second embodiment will be described as referring to FIG. 5. FIG. 5 shows a functional block diagram of a transmitter optical module 1B according to the second embodiment of the present application.

The transmitter optical module 1B provides an optical source 10B that includes an LD 11, an APD 12, and an electro-absorption (EA) modulator 13. The optical source 10B of the present embodiment has a type of what is called, the external modulator. That is, the LD 11 is driven by a DC current to emit continuous light. The EA modulator 13 generates modulated light $L_{OUT}$ by modulating the continuous light generated in the LD 11 based on a modulation signal externally applied thereto. The modulated light $L_{OUT}$ is externally output from the optical source 10B.

The LD 11 is integrated with the EA modulator 13 on a common semiconductor substrate as an optical device 14. The APD 12 is assembled close to the optical device 14 in a can package. Accordingly, the temperature of the LD 11, that of the APD 12, and that of the EA modulator 13 are regarded to be substantially equal to each other.

The LD 11 is coupled with the variable current source 21 to be supplied with a bias current determined by the current controller 22. The current controller 22 determines the bias current dependent on a signal $T_{SENSE}$ provided from the temperature detector 34. That is, the temperature detector 34 outputs the sensing signal $T_{SENSE}$ corresponding to the current temperature of the optical device 14, the current controller 22 determines the bias current based on the sensing signal $T_{SENSE}$, and the current source 21 provides the bias current thus determined to the LD 11.

The EA modulator 13 is coupled with a variable voltage source 41 through inductors, L1 and L2; and a modulation signal source 43 through capacitors, C1 and C2. Two inductors, L1 and L2, cut high frequency components contained in the modulation signal supplied from the modulation signal source 43, while, two capacitors, C1 and C2, cut DC components contained in the bias supplied from the variable voltage source 41. Thus, the EA modulator 13 is biased by the variable voltage source 41 as receiving the modulation signal from the modulation signal source 43.

The variable voltage source 41 is coupled with the bias controller 42 that determines a bias provided to the EA modulator 13 based on the sensing signal $T_{SENSE}$ coming from the temperature detector 34. The modulation signal source 43 is coupled with the amplitude controller 44 that determines, based on the sensing signal $T_{SENSE}$ coming from the temperature detector 34, the amplitude of the modulation signal applied to the EA modulator 13.

The optical source 10B further provides a thermo-electric cooler 15 (hereafter denoted as TEC). The TEC 15 is coupled with a variable current source 16 driven by a TEC-driver 17.

The TEC-driver 17, based on the sensing signal $T_{SENSE}$ provided from the temperature detector 34, determines the driving current for the TEC 15, and the variable current source 16 provides this driving current to the TEC 15.

Arrangements around the APD 12, namely, the variable voltage source 31, the current detector 32, the bias control 33, and the temperature detector 34, are similar to those of the first embodiment shown in FIG. 1. However, the temperature detector 34 provides the sensing signal $T_{SENSE}$, which corresponds to the temperature of the APD 12, provides not only the current controller 22 but the TEC-driver 17, the bias controller 42, and the amplitude controller 44.

Figure 6:
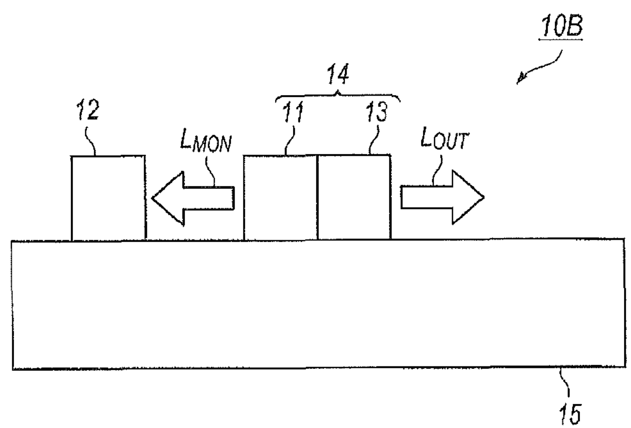
FIG. 6 schematically illustrates an optical source implemented within the optical module shown in FIG. 5.

FIG. 6 schematically illustrates a physical arrangement of the optical source 10B. The LD 11 and the EA modulator 13, as described above, are integrated as the optical device 14. This optical device 14 is mounted on the TEC 15 accompanied with the APD 12. The TEC 15 may adjust the temperature of the LD 11, the APD 12, and the EA modulator 13 mounted thereon.

The optical source 10B may be controlled by manners similar to those of the first embodiment 10A. However, the optical source 10B further controls the temperature of the TEC 15 based on the ratio of the first photocurrent to the second photocurrent. Specifically, the temperature detector 34 determines the temperature of the APD 12 from the ratio of the first photocurrent against the second photocurrent. The TEC-driver 17 determines the driving current supplied to the TEC 15 based on thus determined temperature of the APD 12, and the variable current source 16 provides this driving current to the TEC 15.

Moreover, the optical source 10B of the present embodiment controls the bias voltage and the amplitude of the modulation signal supplied to the EA modulator 13 based on thus determined temperature of the APD 12. The EA modulator 13 shows the optical absorption characteristic considerably sensitive to the temperature thereof. In the present arrangement, the EA modulator 13 is mounted on the TEC 15 as the optical device 14, and the temperature of the TEC 15 is effectively controlled based on the temperature of the APD 12. Then, the bias and the amplitude of the modulation signal each supplied to the EA modulator 13 are necessary to be controlled depending on the temperature thereof.

Figure 7:
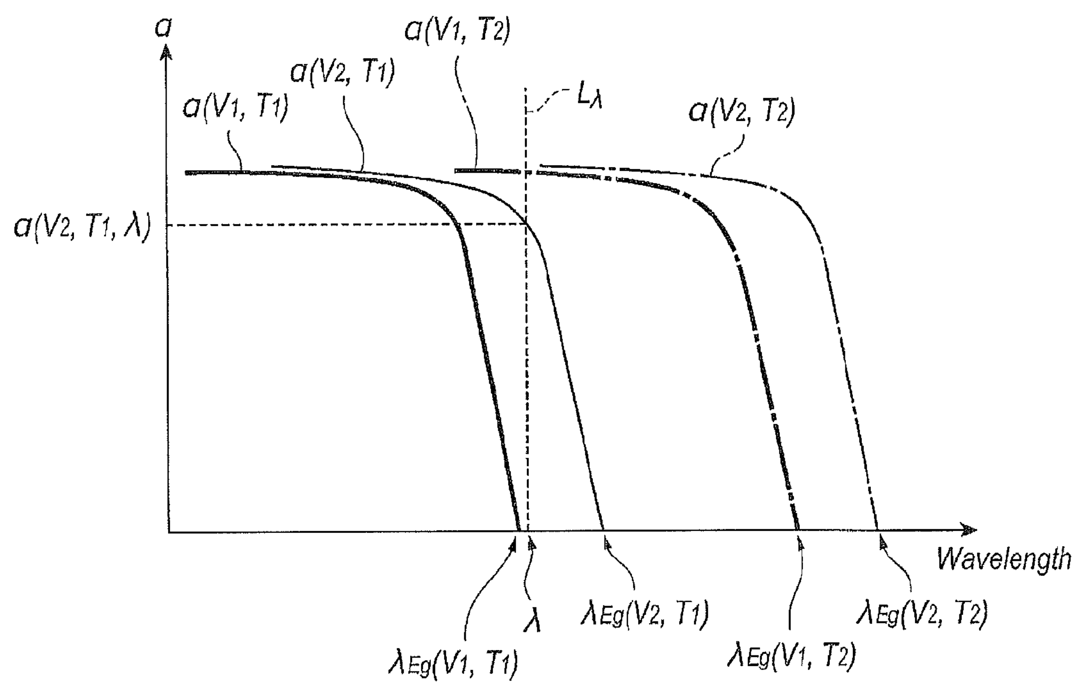
FIG. 7 shows relations of the absorption coefficient of an EA modulator against the wavelength, biases, and temperatures.

FIG. 7 shows the absorption characteristics of the EA modulator 13 against the wavelength in various temperatures. In behaviors $\alpha(V_1, T_1)$, $\alpha(V_2, T_1)$, $\alpha(V_1, T_2)$, and $\alpha(V_2, T_2)$; parameters V and T correspond to the bias and the temperature, respectively. In FIG. 7, the bias V is measured at two levels, $V_1$ and $V_2$, while, the temperature T is measured also in two levels, $T_1$ and $T_2$.

The behavior $\alpha(V_1, T_1)$ rapidly increases at the wavelength $\lambda_{Eg}(V_1, T_1)$, which corresponds to the bandgap energy Eg of a semiconductor material of the EA modulator 13 under the bias $V_1$. Subsequently, the behavior shows a gradual increase as the wavelength becomes shorter. The behavior $\alpha(V_2, T_1)$ also rapidly increases at the wavelength $\lambda_{Eg}(V_2, T_1)$, which corresponds to the bandgap energy Eg under the bias $V_2$; then gradually increases as the wavelength becomes shorter. Other two behaviors, $\alpha(V_1, T_2)$ and $\alpha(V_2, T_2)$, slide the above two behaviors, $\alpha(V_1, T_1)$ and $\alpha(V_2, T_1)$, toward a longer wavelength.

The line $L_\lambda$ on the wavelength λ does not intersect with the behavior $\alpha(V_1, T_1)$, which means that, setting the bias of the EA modulator 13 in $V_1$, the EA modulator 13 becomes substantially transparent, that is, the EA modulator 13 absorbs substantially no light. On the other hand, the line $L_\lambda$ intersects the behavior $\alpha(V_2, T_1)$ at the point $(\alpha(V_2, T_1), \lambda)$ and this point is almost the maximum of the behavior $\alpha(V_2, T_1)$, which means that the EA modulator 13 absorbs the light with the wavelength λ by setting the bias to be $V_2$.

Accordingly, the EA modulator 13 may modulate the light with the wavelength of λ by changing the bias thereof between two levels of $V_1$ and $V_2$, or by the modulation signal with the amplitude $\Delta V=V_2-V_1$ and the bias $(V_2+V_1)/2$. Exactly, the absorption of the EA modulator 13 shows a non-linear characteristic against the bias thereof. The bias applied to the EA modulator 13 is necessary to be offset from the center of two biases above described.

When the temperature of the EA modulator 13 becomes $T_2$ from $T_1$, two behaviors, $\alpha(V_1, T_1)$ and $\alpha(V_2, T_1)$, shift to other two behaviors, $\alpha(V_1, T_2)$ and $\alpha(V_2, T_2)$, respectively, in the longer wavelength. Thus, the absorption characteristic of the EA modulator 13 is sensitive to the temperature. In order to operate the EA modulator 13 for the light with the wavelength λ at the temperature $T_2$, two behaviors, $\alpha(V_1, T_2)$ and $\alpha(V_2, T_2)$, are necessary to shift to the positions of the two behaviors, $\alpha(V_1, T_1)$ and $\alpha(V_2, T_1)$, by adjusting the bias applied to the EA modulator 13.

Thus, the bias applied to the EA modulator 13 is necessary to be set sensitive to the temperature thereof. The optical source 10B of the present embodiment, the optical device 14 that integrates the LD with the EA modulator 13, is mounted on the TEC 15, and the TEC also mounts the APD 12. Accordingly, the optical source 10B may detect the temperature of the TEC 12 through the algorithm thus described by the APD 12, and the EA modulator 13 may be adequately controlled in the bias and the modulation amplitude depending on thus determined temperature of the APD 12.

Although the present invention has been described in relation to particular embodiments thereof, many other variations and modifications will become apparent to those skilled in the art. For instance, the method shown in FIG. 4 may start steps S13 and S14 after a difference of the first photocurrents measured in intermittently iterated steps S11 becomes less than a preset range. This modification is particularly effective when the amplitude of the monitored light $L_{MON}$ from the LD 11 fluctuates just after the LD 11 is started to emit light with the selected wavelength. Thus, it is preferable that the present invention be limited not by the specific disclosure herein, but only by the appended claims.

What is claimed is:

1. A method to set a bias current in a laser diode (LD) accompanying with an avalanche photodiode (APD) to monitor light output from the LD, the APD being set in a thermal condition same with a thermal condition of the LD, comprising steps of:

measuring a first photocurrent generated by the APD as providing a first bias to the APD, the first bias setting a multiplication factor of the APD equal to an unity;

measuring a second photocurrent generated by the APD as providing a second bias to the APD, the second bias setting the multiplication factor of the APD greater than the unity;

determining a temperature of the LD by calculating a ratio of the first photocurrent to the second photocurrent; and providing another bias current to the LD, the another bias current corresponding to the determined temperature of the LD.

2. The method of claim 1, wherein the steps of measuring the first current and the second photocurrent supply a constant bias current common to the steps.

3. The method of claim 1, further including a step of, after measuring the second current, iterating the steps of measuring the first photocurrent and measuring the second photocurrent until the intermittently measured first photocurrent converges with a preset range.

4. The method of claim 1, wherein the LD is integrated with an electro-absorption (EA) modulator as an optical device mounted on a thermo-electric cooler (TEC), and wherein the method further includes steps of, after determining the temperature of the LD, providing a bias voltage and a modulation signal with amplitude to the EA modulator, the bias voltage and the amplitude corresponding to the temperature of the LD.

5. The method of claim 4, wherein the LD is mounted on a thermo-electric cooler (TEC), and wherein the method further includes a step of, after determining the temperature of the LD, controlling the TEC based on the temperature of the LD.

6. A method to control a transmitter optical module that installs a semiconductor laser diode (LD) integrated with an electro-absorption (EA) modulator as an optical device and an avalanche photodiode (APD) to monitor light output from the LD, the APD being positioned close to the optical device to be set in a thermal condition same as a thermal condition of the optical device, the method comprising steps of:

setting a first bias to the APD such that the APD shows a multiplication factor thereof equal to an unity as the LD is biased by a bias current;

measuring a first photocurrent output from the APD;

setting a second bias to the APD such that the APD shows the multiplication factor greater than the unity as the LD is biased by the bias current;

measuring a second photocurrent output from the APD;

determining a temperature of the LD from a ratio of the first photocurrent to the second photocurrent; and providing another bias current corresponding to the temperature of the LD to emit light with preset power.

7. The method of claim 6, wherein the transmitter optical module further includes a thermo-electric cooler (TEC) that mounts the LD and the APD, and wherein the method further includes a step of, after determining the temperature of the LD, controlling a temperature of the TEC based on the temperature of the LD.

8. The method of claim 6, further including a step of, after determining the temperature of the LD, providing a bias voltage and a modulation signal with amplitude to the EA modulator, the bias voltage and the amplitude depending on the temperature of the LD.

9. The method of claim 6, further including, after measuring the second photocurrent, iterating steps of measuring the first photocurrent and measuring the second photocurrent until intermittently measured first photocurrent converges within a preset range.

10. A transmitter optical module, comprising:

an optical source including a semiconductor laser diode (LD) and an avalanche photodiode (APD), the APD monitoring amplitude of light output from the LD and generating a photocurrent corresponding to the amplitude, the APD being set in a thermal condition substantially same with a thermal condition of the LD; and a temperature detector to set a first bias and a second bias to the APD, the temperature detector determining a temperature of the APD by calculating a ratio of a first photocurrent measured at the first bias against a second photocurrent measured at the second bias, wherein the first bias sets the APD in a multiplication factor thereof substantially equal to unity, and the second bias sets the APD in the multiplication factor thereof greater than the unity.

11. The transmitter optical module of claim 10, wherein the LD accompanies with no temperature sensor.

12. The transmitter optical module of claim 11, wherein the LD integrates with an electro-absorption (EA) modulator provided with a bias voltage and a modulation signal with amplitude, wherein the bias voltage and the amplitude are determined by the temperature of the APD.

13. The transmitter optical module of claim 12, further including a thermo-electric cooler (TEC) that mounts the LD integrated with the EA modulator and the APD, wherein the temperature of the TEC is controlled based on the temperature of the APD.

* * * * *